United States Patent
Halberstadt et al.

(10) Patent No.: US 11,835,997 B2
(45) Date of Patent: Dec. 5, 2023

(54) SYSTEMS AND METHODS FOR LIGHT FIXTURE LOCATION DETERMINATION

(71) Applicant: Electronic Theatre Controls, Inc., Middleton, WI (US)

(72) Inventors: Matt Halberstadt, Middleton, WI (US); Josh Jordan, Middleton, WI (US); Zoe Wolter, Middleton, WI (US); Dennis Varian, Middleton, WI (US); Lowell Olcott, Middleton, WI (US)

(73) Assignee: Electronic Theatre Controls, Inc., Middleton, WI (US)

( * ) Notice: Subject to any disclaimer, the term of this patent is extended or adjusted under 35 U.S.C. 154(b) by 281 days.

(21) Appl. No.: 17/028,212

(22) Filed: Sep. 22, 2020

(65) Prior Publication Data

US 2021/0097214 A1     Apr. 1, 2021

Related U.S. Application Data

(60) Provisional application No. 62/906,889, filed on Sep. 27, 2019.

(51) Int. Cl.
*G06F 30/13* (2020.01)
*G06T 7/62* (2017.01)
*G06T 7/00* (2017.01)

(52) U.S. Cl.
CPC ............ *G06F 30/13* (2020.01); *G06T 7/0004* (2013.01); *G06T 7/62* (2017.01); *G06T 7/97* (2017.01); *G06T 2207/30184* (2013.01)

(58) Field of Classification Search
CPC . G06T 2207/30184; G06T 7/97; G06T 7/579; G06T 7/70; G06T 7/55;
(Continued)

(56) References Cited

U.S. PATENT DOCUMENTS 9,952,305 B2   4/2018   Ganick et al.
10,187,163 B2  1/2019   Breuer et al.
(Continued)

FOREIGN PATENT DOCUMENTS

CN    111179339 A      5/2020
DE    102017110533 A1  11/2018
(Continued)

OTHER PUBLICATIONS

Combined Search and Examination Report issued from the United Kingdom Patent Office for related Application No. GB2116696.2 dated Apr. 26, 2022 (5 Pages).
(Continued)

*Primary Examiner* — Sumati Lefkowitz
*Assistant Examiner* — Michael Adam Shariff
(74) *Attorney, Agent, or Firm* — Michael Best & Friedrich LLP (57) ABSTRACT

A system for determining a location of a lighting fixture in a venue includes a camera and a controller. The camera captures images of the lighting fixture. The controller is operatively coupled to the camera. The controller designates a first position of the camera, receives a first image of the lighting fixture from the camera in the first position, determines a first distance vector between the first position and the lighting fixture based on the first image, designates a second position of the camera, receives a second image of the lighting fixture from the camera in the second position, determines a second distance vector between the second position and the lighting fixture based on the second image, determines a vector relationship location to be a location nearest both the first distance vector and the second distance vector, and designates the vector relationship location as the location of the lighting fixture.

22 Claims, 4 Drawing Sheets

(58) Field of Classification Search
CPC .......... G06T 7/80; G06T 7/62; G06T 7/0004; G06T 7/73; G06T 7/60; G06F 30/13; G06F 30/10; G06F 30/12; E04H 3/22; F21W 2131/406; H04N 5/2256; F21V 14/00; F21V 14/02; F21V 21/14; F21V 21/15; H05B 47/10; H05B 47/105; H05B 47/155; H05B 47/175; H05B 47/19; H05B 47/18

See application file for complete search history.

(56) References Cited

U.S. PATENT DOCUMENTS

| | | | |
|---|---|---|---|
| 10,210,426 | B2 | 2/2019 | Rajagopalan et al. |
| 10,768,271 | B2 * | 9/2020 | Holtman .................. G01S 1/70 |
| 10,817,054 | B2 * | 10/2020 | Jeon ........................ G06V 40/19 |
| 10,859,247 | B2 * | 12/2020 | Rasmussen .......... H05B 47/115 |
| 11,224,111 | B2 * | 1/2022 | Meerbeek ............... H05B 47/10 |
| 2003/0012410 | A1 | 1/2003 | Navab et al. |
| 2008/0231729 | A1 | 9/2008 | Sato et al. |
| 2011/0102580 | A1 * | 5/2011 | Langdon .................. G01C 1/04 |
| | | | 348/135 |
| 2012/0286670 | A1 | 11/2012 | Van Herk et al. |
| 2014/0063061 | A1 | 3/2014 | Reitan |
| 2014/0347394 | A1 | 11/2014 | Padilla |
| 2017/0099439 | A1 * | 4/2017 | Pulli .................... H04N 23/698 |
| 2017/0160371 | A1 | 6/2017 | Bockle et al. |
| 2018/0368239 | A1 | 12/2018 | Meerbeek et al. |
| 2018/0374271 | A1 | 12/2018 | Sourimant et al. |
| 2020/0202572 | A1 * | 6/2020 | Wieneke ................... G01P 5/20 |
| 2021/0042525 | A1 * | 2/2021 | Secretin ................. G06V 20/20 |
| 2021/0243873 | A1 * | 8/2021 | Ishida .................. H04N 23/698 |

FOREIGN PATENT DOCUMENTS

| | | | | |
|---|---|---|---|---|
| JP | 2000028332 | A | * | 1/2000 |
| JP | 2000028332 | A | | 1/2000 |
| JP | 2000028332 | A | | 1/2000 |
| JP | 2014235907 | A | | 12/2014 |
| JP | 2019132673 | A | * | 8/2019 |
| KR | 20190085620 | A | | 7/2019 |

OTHER PUBLICATIONS

Examination Report issued from the United Kingdom Patent Office for related Application No. GB2015010.8 dated Sep. 20, 2021 (2 Pages).

Combined Search and Examination Report issued from the United Kingdom Patent Office for related Application No. GB2015010.8 dated Mar. 8, 2021 (6 Pages).

German Patent Office Action for Related Application No. 102020124688.9 dated Dec. 2, 2022 (13 pages, including an English statement of relevance).

English translation of portions of Japanese Patent No. 2019132673 A, received Jul. 19, 2023 (3 pages).

* cited by examiner

SYSTEMS AND METHODS FOR LIGHT FIXTURE LOCATION DETERMINATION

RELATED APPLICATIONS

This application claims the benefit of U.S. Provisional Patent Application No. 62/906,889, filed Sep. 27, 2019, the entire content of which is hereby incorporated by reference.

FIELD

Embodiments described herein relate to locating and subsequently controlling one or more lighting fixtures.

SUMMARY

A component of accurately rendering and controlling lighting visuals, either directly with a lighting console or through an interactive environment, is having accurate information regarding the lighting fixtures. Particularly, the arrangement information (such as the location and orientation) of each lighting fixture should be known with a fair amount of accuracy. For example, even an inch of discrepancy between the location data and the real world location of the lighting fixture can cause the projected lighting beam to be multiple feet away from the intended lighting beam destination. Additionally or alternatively, a discrepancy of only a few degrees between the orientation data and the real world orientation of the lighting fixture can cause a similar inaccuracy.

Currently, a user must make precise measurements to accurately determine the location of a lighting fixture. To determine orientation, the user must also have specific knowledge of the lighting fixture and its current hanging method. Because lighting fixtures can be mounted to rafters, scaffolding, pipes, or any other structure in any number of ways, this methodology requires significant time and effort to accomplish. Furthermore, the user must be experienced through prior use and/or technical training in order to utilize the required measurement tools and techniques. Because of the requirement for a trained and/or experienced individual, a specialized technician is often contracted. Also, these techniques are prone to human error, which can only be detected when a user attempts to control the one or more lighting fixtures according to a desired lighting visual. Once the discrepancy is discovered, which can be at a late hour in the setup process at a venue, the user must perform the measurement process again for the incorrectly calibrated light. If a specialized technician was contracted, the same or another specialized technician may need to perform the process with short notice. Because the time of the event at the venue often establishes a firm completion deadline, this process can be stressful, inconvenient, and expensive.

An automated or semi-automated technique for determining the arrangement (e.g., location and/or orientation) of a lighting fixture based on captured image data from one or more cameras would significantly decrease venue lighting setup time and make venue lighting setup more efficient when compared to conventional venue lighting setup techniques. Additionally, because the lighting fixture arrangement information can be determined with accuracy, subsequently controlling the lighting fixtures based on the determined locations of the lighting fixtures in the automated or semi-automated manner is similarly available at a venue sooner and with corresponding accuracy.

Systems described herein provide for determining a location of a lighting fixture in a venue. The systems include a camera and a controller. The camera is able to capture images of the lighting fixture. The controller is operatively coupled to the camera. The controller is able to designate a first position of the camera, receive a first image of the lighting fixture from the camera in the first position, determine a first distance vector between the camera at the first position and the lighting fixture based on the first image, designate a second position of the camera, receive a second image of the lighting fixture from the camera in the second position, determine a second distance vector between the camera at the second position and the lighting fixture based on the second image, determine a vector relationship location to be a location nearest both the first distance vector and the second distance vector, and designate the vector relationship location as the location of the lighting fixture.

Systems described herein provide for determining a location of a lighting fixture in a venue. The systems include a first camera, a second camera, and a controller. The first camera is placed in a first position. The first camera is able to capture a first image of the lighting fixture. The second camera is placed in a second position. The second camera is able to capture a second image of the lighting fixture. The controller is operatively coupled to the first camera and the second camera. The controller is able to designate the first position of the first camera, receive the first image of the lighting fixture from the first camera, determine a first distance vector between the first camera at the first position and the lighting fixture based on the first image, designate the second position of the second camera, receive the second image of the lighting fixture from the second camera, determine a second distance vector between the second camera at the second position and the lighting fixture based on the second image, determine a vector relationship location to be a location nearest both the first distance vector and the second distance vector, and designate the vector relationship location as the location of the lighting fixture.

Methods described herein provide for determining a location of a lighting fixture in a venue. The methods include capturing a first image of the lighting fixture from a first position, determining a first distance vector between the first position and the lighting fixture, capturing a second image of the lighting fixture from a second position, determining a second distance vector between the second position and the lighting fixture, determining a vector relationship location where the first distance vector and the second distance vector are nearest to each other, and designating the vector relationship location as the location of the lighting fixture.

Before any embodiments are explained in detail, it is to be understood that the embodiments are not limited in its application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software based devices, as well as a plurality of different structural components, may be utilized to implement the embodiments. For example, "servers," "computing devices," "controllers," "processors," etc., described in the specification can include one or more processing units, one or more computer-readable medium modules, one or more input/output interfaces, and various connections (e.g., a system bus) connecting the components.

Relative terminology, such as, for example, "about," "approximately," "substantially," etc., used in connection with a quantity or condition would be understood by those of ordinary skill to be inclusive of the stated value and has the meaning dictated by the context (e.g., the term includes at least the degree of error associated with the measurement accuracy, tolerances [e.g., manufacturing, assembly, use, etc.] associated with the particular value, etc.). Such terminology should also be considered as disclosing the range defined by the absolute values of the two endpoints. For example, the expression "from about 2 to about 4" also discloses the range "from 2 to 4". The relative terminology may refer to plus or minus a percentage (e.g., 1%, 5%, 10%, or more) of an indicated value.

It should be understood that although certain drawings illustrate hardware and software located within particular devices, these depictions are for illustrative purposes only. Functionality described herein as being performed by one component may be performed by multiple components in a distributed manner. Likewise, functionality performed by multiple components may be consolidated and performed by a single component. In some embodiments, the illustrated components may be combined or divided into separate software, firmware and/or hardware. For example, instead of being located within and performed by a single electronic processor, logic and processing may be distributed among multiple electronic processors. Regardless of how they are combined or divided, hardware and software components may be located on the same computing device or may be distributed among different computing devices connected by one or more networks or other suitable communication links. Similarly, a component described as performing particular functionality may also perform additional functionality not described herein. For example, a device or structure that is "configured" in a certain way is configured in at least that way but may also be configured in ways that are not explicitly listed.

Other aspects of the embodiments will become apparent by consideration of the detailed description and accompanying drawings.

DETAILED DESCRIPTION

Accurately determining the arrangement information of one or more lighting fixtures in a venue conventionally requires skilled technicians, precise and expensive measuring tools, and a significant amount of time. Accordingly, to address these and other technical problems associated with determining the arrangement information of one or more lighting fixtures, and later controlling the one or more lighting fixtures, systems, methods, and devices described herein provide arrangement information acquisition and subsequent lighting fixture control.

Figure 1:
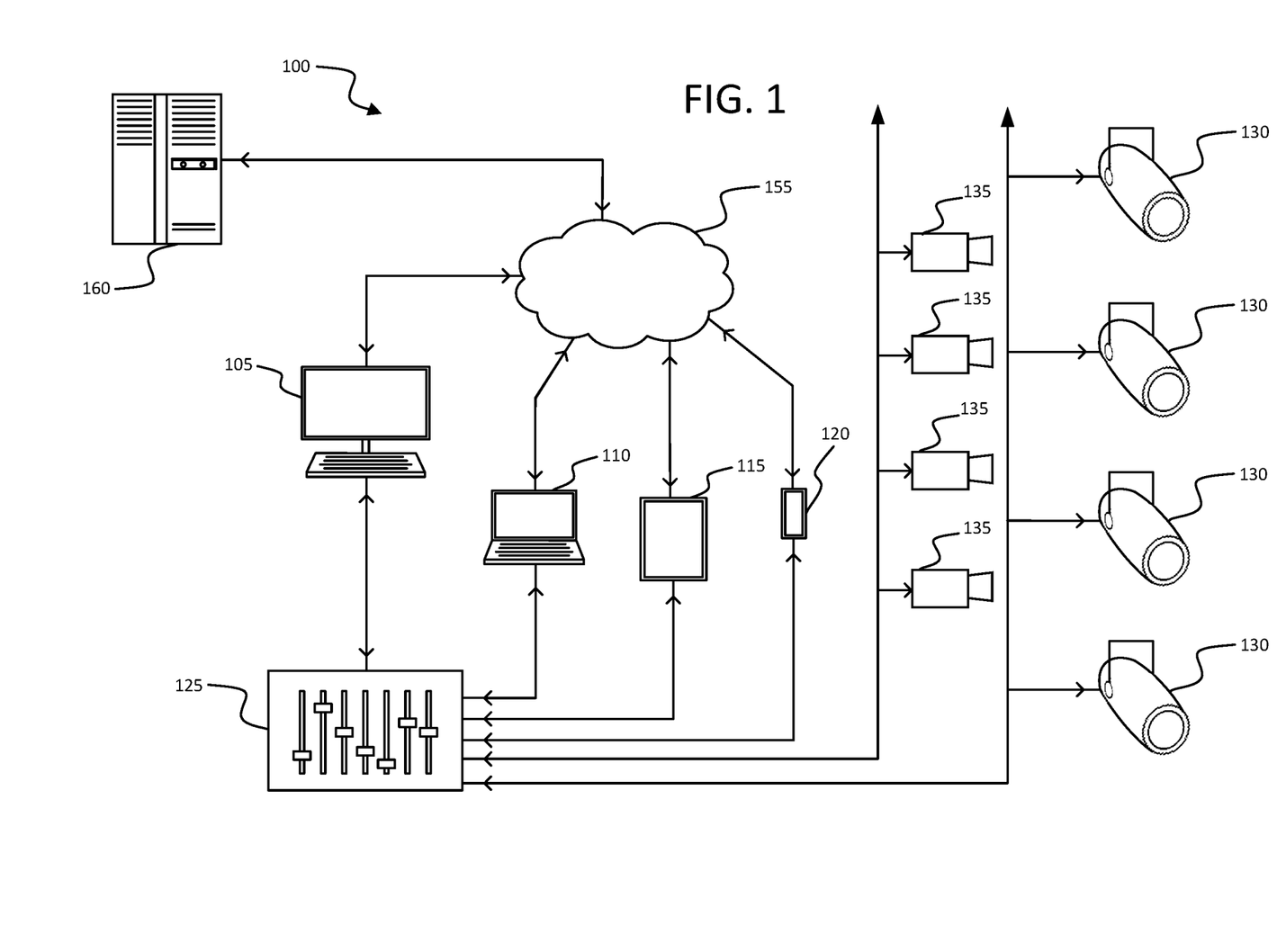
FIG. 1 illustrates a system for determining the arrangement information of one or more lighting fixtures and subsequently controlling the lighting fixtures.

FIG. 1 illustrates a system 100 for determining the arrangement information of one or more lighting fixtures and subsequently controlling the lighting fixtures. The system 100 includes a user input device 105-120, a control board or control panel 125, a lighting fixture 130, a camera 135, a network 155, and a server-side mainframe computer or server 160. The user input device 105-120 includes, for example, a personal or desktop computer 105, a laptop computer 110, a tablet computer 115, or a mobile phone (e.g., a smart phone) 120. Other user input devices may include, for example, an augmented reality headset or glasses. In some embodiments, the camera 135 may be integrated with the user input device 105-120, such as the camera of the mobile phone 120. In other embodiments, the camera 135 may be entirely separate from the user input device 105-120.

The user input device 105-120 is configured to communicatively connect to the server 160 through the network 155 and provide information to, or receive information from, the server 160 related to the control or operation of the system 100. The user input device 105-120 is also configured to communicatively connect to the control board 125 to provide information to, or receive information from, the control board 125. The connections between the user input device 105-120 and the control board 125 or network 155 are, for example, wired connections, wireless connections, or a combination of wireless and wired connections. Similarly, the connections between the server 160 and the network 155, the control board 125 and the lighting fixtures 130, or the control board 125 and the camera 135 are wired connections, wireless connections, or a combination of wireless and wired connections.

The network 155 is, for example, a wide area network ("WAN") (e.g., a TCP/IP based network), a local area network ("LAN"), a neighborhood area network ("NAN"), a home area network ("HAN"), or personal area network ("PAN") employing any of a variety of communications protocols, such as Wi-Fi, Bluetooth, ZigBee, etc. In some implementations, the network 155 is a cellular network, such as, for example, a Global System for Mobile Communications ("GSM") network, a General Packet Radio Service ("GPRS") network, a Code Division Multiple Access ("CDMA") network, an Evolution-Data Optimized ("EV-DO") network, an Enhanced Data Rates for GSM Evolution ("EDGE") network, a 3GSM network, a 4GSM network, a 4G LTE network, a 5G New Radio, a Digital Enhanced Cordless Telecommunications ("DECT") network, a Digital AMPS ("IS-136/TDMA") network, or an Integrated Digital Enhanced Network ("iDEN") network, etc.

Figure 2:
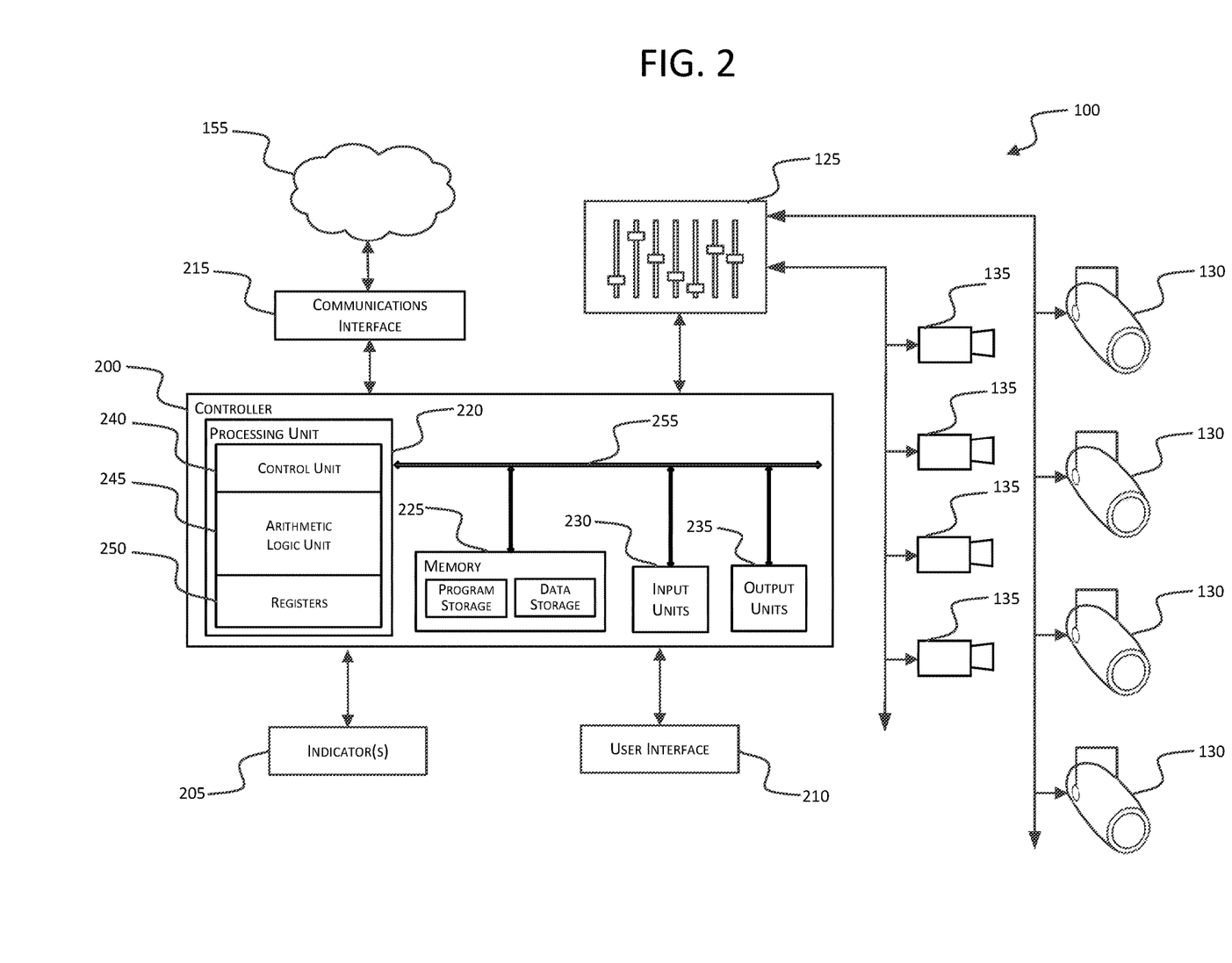
FIG. 2 illustrates a controller for the system of FIG. 1.

FIG. 2 illustrates a controller 200 for the system 100. The controller 200 is electrically and/or communicatively connected to a variety of modules or components of the system 100. For example, the illustrated controller 200 is connected to one or more indicators 205 (e.g., LEDs, a liquid crystal display ["LCD"], etc.), a user input or user interface 210 (e.g., a user interface of the user input device 105-120 in FIG. 1), and a communications interface 215. The controller 200 is also connected to the control board 125. The communications interface 215 is connected to the network 155 to enable the controller 200 to communicate with the server 160. The controller 200 includes combinations of hardware and software that are operable to, among other things, control the operation of the system 100, control the operation of the lighting fixture 130, control the operation of the camera 135, receive one or more signals from the camera 135, communicate over the network 155, communicate with the control board 125, receive input from a user via the user interface 210, provide information to a user via the indicators 205, etc. In some embodiments, the indicators 205 and the user interface 210 may be integrated together in the form of, for instance, a touch-screen.

In the embodiment illustrated in FIG. 2, the controller 200 would be associated with the user input device 105-120. As a result, the controller 200 is illustrated in FIG. 2 as being connected to the control board 125 which is, in turn, connected to the lighting fixture 130 and the camera 135. In other embodiments, the controller 200 is included within the control board 125, and, for example, the controller 200 can provide control signals directly to the lighting fixture 130 and the camera 135. In other embodiments, the controller 200 is associated with the server 160 and communicates through the network 155 to provide control signals to the control board 125, the lighting fixture 130, and the camera 135.

The controller 200 includes a plurality of electrical and electronic components that provide power, operational control, and protection to the components and modules within the controller 200 and/or the system 100. For example, the controller 200 includes, among other things, a processing unit 220 (e.g., a microprocessor, a microcontroller, an electronic processor, an electronic controller, or another suitable programmable device), a memory 225, input units 230, and output units 235. The processing unit 220 includes, among other things, a control unit 240, an arithmetic logic unit ("ALU") 245, and a plurality of registers 250 (shown as a group of registers in FIG. 2), and is implemented using a known computer architecture (e.g., a modified Harvard architecture, a von Neumann architecture, etc.). The processing unit 220, the memory 225, the input units 230, and the output units 235, as well as the various modules or circuits connected to the controller 200 are connected by one or more control and/or data buses (e.g., common bus 255). The control and/or data buses are shown generally in FIG. 2 for illustrative purposes. The use of one or more control and/or data buses for the interconnection between and communication among the various modules, circuits, and components would be known to a person skilled in the art in view of the embodiments described herein.

The memory 225 is a non-transitory computer readable medium and includes, for example, a program storage area and a data storage area. The program storage area and the data storage area can include combinations of different types of memory, such as a ROM, a RAM (e.g., DRAM, SDRAM, etc.), EEPROM, flash memory, a hard disk, an SD card, or other suitable magnetic, optical, physical, or electronic memory devices. The processing unit 220 is connected to the memory 225 and executes software instructions that are capable of being stored in a RAM of the memory 225 (e.g., during execution), a ROM of the memory 225 (e.g., on a generally permanent basis), or another non-transitory computer readable medium such as another memory or a disc. Software included in the implementation of the system 100 and controller 200 can be stored in the memory 225 of the controller 200. The software includes, for example, firmware, one or more applications, program data, filters, rules, one or more program modules, and other executable instructions. The controller 200 is configured to retrieve from the memory 225 and execute, among other things, instructions related to the control processes and methods described herein. In other embodiments, the controller 200 includes additional, fewer, or different components.

The user interface 210 is included to provide user control of the system 100, the lighting fixture 130, and/or the camera 135. The user interface 210 is operably coupled to the controller 200 to control, for example, drive signals provided to the lighting fixture 130 and/or drive signals provided to the camera 135. The user interface 210 can include any combination of digital and analog input devices required to achieve a desired level of control for the system 100. For example, the user interface 210 can include a computer having a display and input devices, a touch-screen display, a plurality of knobs, dials, switches, buttons, faders, or the like. In the embodiment illustrated in FIG. 2, the user interface 210 is separate from the control board 125. In other embodiments, the user interface 210 is included in the control board 125.

The controller 200 is configured to work in combination with the control board 125 to provide direct drive signals to the lighting fixtures 130 and/or the cameras 135. As described above, in some embodiments, the controller 200 is configured to provide direct drive signals to the lighting fixtures 130 and/or the cameras 135 without separately interacting with the control board 125 (e.g., the control board 125 includes the controller 200). The direct drive signals that are provided to the lighting fixtures 130 and/or the cameras 135 are provided, for example, based on a user input received by the controller 200 from the user interface 210. The controller 200 is also configured to receive one or more signals from the camera(s) 135 related to scan or image data.

Figure 3:
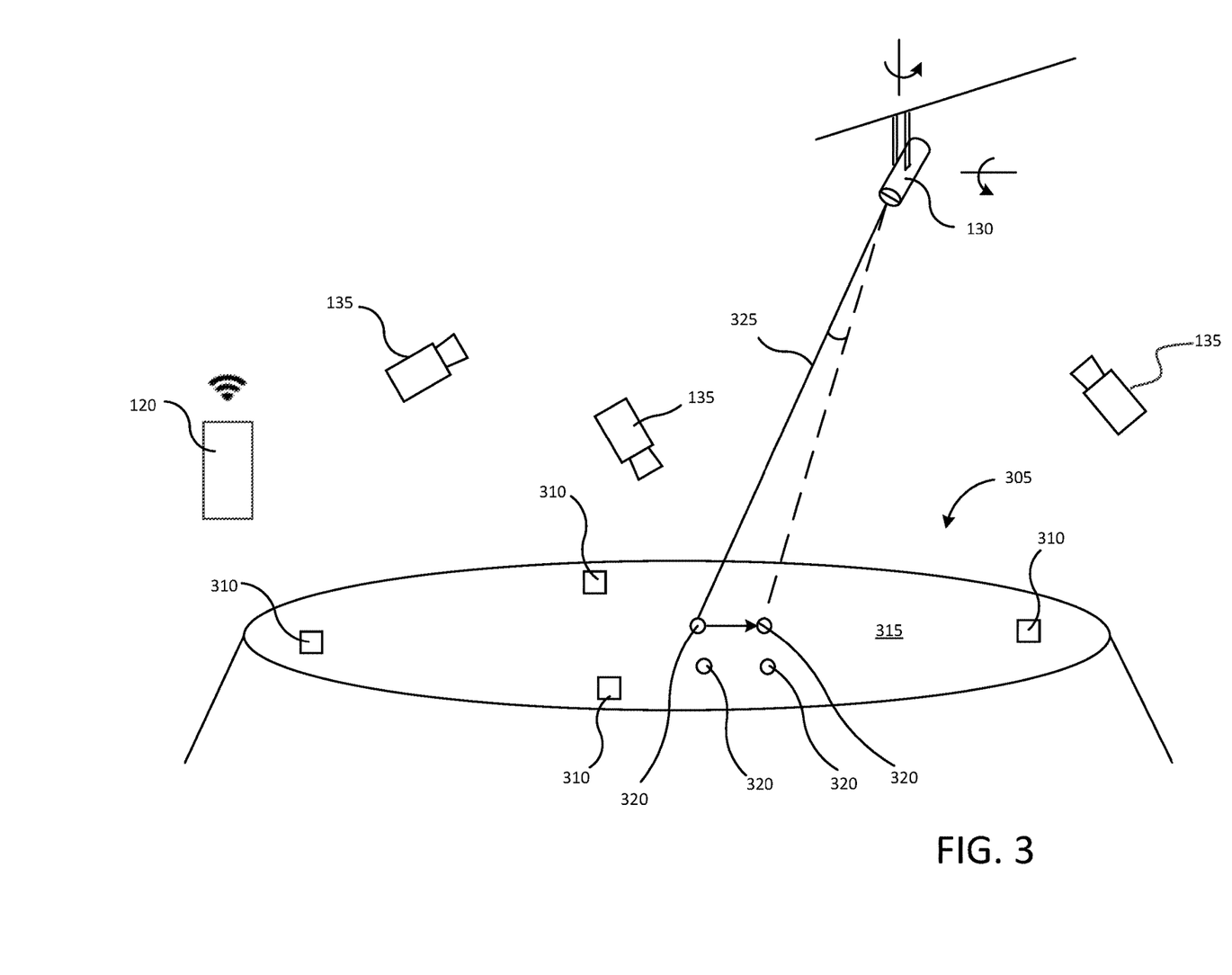
FIG. 3 illustrates cameras and a lighting fixture of the system of FIG. 1 in a venue.

FIG. 3 illustrates examples of where the camera(s) 135 can be located to capture visual information or images related to the lighting fixture 130. In a system 100 using only one camera 135, the user moves the camera 135 to multiple discrete locations (at least two locations) to view the lighting fixture 130 from multiple vantage points. Moving the camera 135 can include, for instance, mounting the camera 135 in a first known position and then remounting the camera 135 in a second known position. With the known mounting positions used as inputs for the controller 200, the location of the lighting fixture 130 can be calculated. Other embodiments in which the camera 135 is integrated into the user input device 105-120 (such as a mobile phone 120) include, for instance, moving the camera 135 by walking from a first location in the venue 305 to a second location in the venue 305 to view the lighting fixture 130 from both the first location and the second location with the camera 135. In a system 100 using more than one camera 135, each camera can be permanently mounted in a respective known position.

In some embodiments, at least two locations of the camera(s) 135 must be known in order to calculate the location of the lighting fixture 130. As discussed above, the camera(s) 135 can be mounted in known locations. These locations can be ascertained, for instance, by traditional measurement methods. In such embodiments, the user inputs the coordinate data of the camera 135 manually via, for instance, the user interface 210.

In some embodiments, the position of the camera 135 can be determined using the position of the camera 135 relative to one or more reference points 310 using the scan data from the camera 135. The reference points 310 provide orientation and distance information for the controller 200 to determine the camera's position. In some embodiments, the reference points 310 are simple visible marks on the stage surface 315 at the venue 305. Other embodiments include at least one reference point 310 that is a sensor-readable marker not visible to the human eye (e.g., infrared).

Using known scanning applications, such as augmented reality application libraries on a smartphone (e.g., ARKit by Apple, ARCore by Google, Vuforia, Wikitude, EasyAR, Kudan, Onirix, MaxST, Pikkart AR SDK, DeepAR, Lumin/Magic Leap, MixedReality Toolkit), the controller 200 may determine a distance or distance vector in three-dimensional space (e.g., having a magnitude and a three-dimensional angle) between the camera 135 and the lighting fixture 130. After the user moves the camera 135 to a second location, or after a second camera 135 is utilized, the determination of a distance or distance vector in three-dimensional space between the camera 135 and the lighting fixture 130 is made again. The controller 200 determines a first distance vector using the known coordinates of the first camera location and the distance in three-dimensional space between the camera 135 at the first position and the lighting fixture 130. The controller 200 also determines a second distance vector using the known coordinates of the second camera location and the distance in three-dimensional space between the camera 135 at the second position and the lighting fixture 130. The controller 200 then determines a vector relationship location where the first distance vector intersects with the second distance vector. In other embodiments, the controller 200 instead determines a vector relationship location where the two distance vectors are nearest or closest to each other, which may or may not include a point of intersection.

Although some embodiments only utilize two locations for the one or more cameras 135, more accuracy for the location of the lighting fixture 130 can be attained with additional locations for the camera(s) 135. The determination would continue with the same steps as above, but with a third camera position, a fourth camera position, and so on until the desired accuracy is achieved.

In some embodiments, the system 100 also automatically recognizes, identifies, or otherwise designates a lighting fixture 130 that is in the scanning field of a given camera 135. Some embodiments include a smart-scan feature that recognizes known lighting fixtures 130 using scanning methods such as simultaneous localization and mapping ("SLAM") and comparing the scan data with a corresponding library of lighting fixtures (e.g., stored in the memory 225, server 160, etc.). In some embodiments, the controller 200 may also interpret the shape of the lighting fixture 130 in ascertaining the orientation of the lighting fixture 130 in addition to the location of the lighting fixture 130 and identification of the light fixture 130.

Other embodiments include an augmented reality display shown on, for instance, a touch-screen of the user interface 210 of the mobile phone 120. A user can point the camera 135 at a given lighting fixture 130 and, once the lighting fixture 130 appears in the field of view of the camera 135 (and, therefore, on the display of the user interface 210), the user can select the portion of the display corresponding to the location of the lighting fixture 130. In embodiments utilizing a touch-screen user interface 210, the user need only touch the screen by tapping on the image of the lighting fixture 130. A box, a dot, an X, or some other designation may optionally appear on the display of the indicator 205 to provide the user with feedback as to the location on the display of the input made by touching the screen. In some embodiments, the system 100 provides the user with the option of updating the location indicated or confirming the location indicated.

Some embodiments include one or more sensor-readable markers disposed on the lighting fixture 130. The camera 135 scans the sensor-readable marker(s) and the controller 200 interprets the location of the marker(s) as corresponding to the location of the lighting fixture 130. In some embodiments, these markers may be in a pattern on the lighting fixture 130 to indicate an outline of the lighting fixture 130, a forward direction of the lighting fixture 130, a make/model of the lighting fixture 130, or the like. The controller 200 may interpret this pattern information in ascertaining the orientation of the lighting fixture 130 in addition to the location of the lighting fixture 130.

In some embodiments, the above determinations of lighting fixture location and orientation are used to supplement prior determinations of location and orientation made through other means. For instance, the above-described system 100 can be used as a way to check the accuracy of the determined location of a lighting fixture 130 that was found using hand measurements. Additionally or alternatively, the above-described system 100 can be used to verify or supplement the results of determinations using a camera 135 to scan discrete light projection locations 320 where the lighting beam 325 emitted from the lighting fixture 130 projects onto the surface 315 of the stage in the venue 305. The camera 135 scanning the light projection locations 320 may be the same as the cameras 135 discussed above, or it may be different from those discussed above.

Once the location and orientation of the lighting fixture 130 has been determined with the desired accuracy, the user may then control the lighting fixture 130 by, for instance, inputting commands via the control board 125, indicating a destination on the stage surface 315 of the venue 305 via a touch-screen of a user interface 210 of a mobile phone 120 displaying augmented reality, pointing a destination indication wand or device, or the like. The controller 200 then controls the lighting fixture 130 to project light to a desired location, to change an orientation of the light fixture 130, change an output of the light fixture 130, etc.

Figure 4:
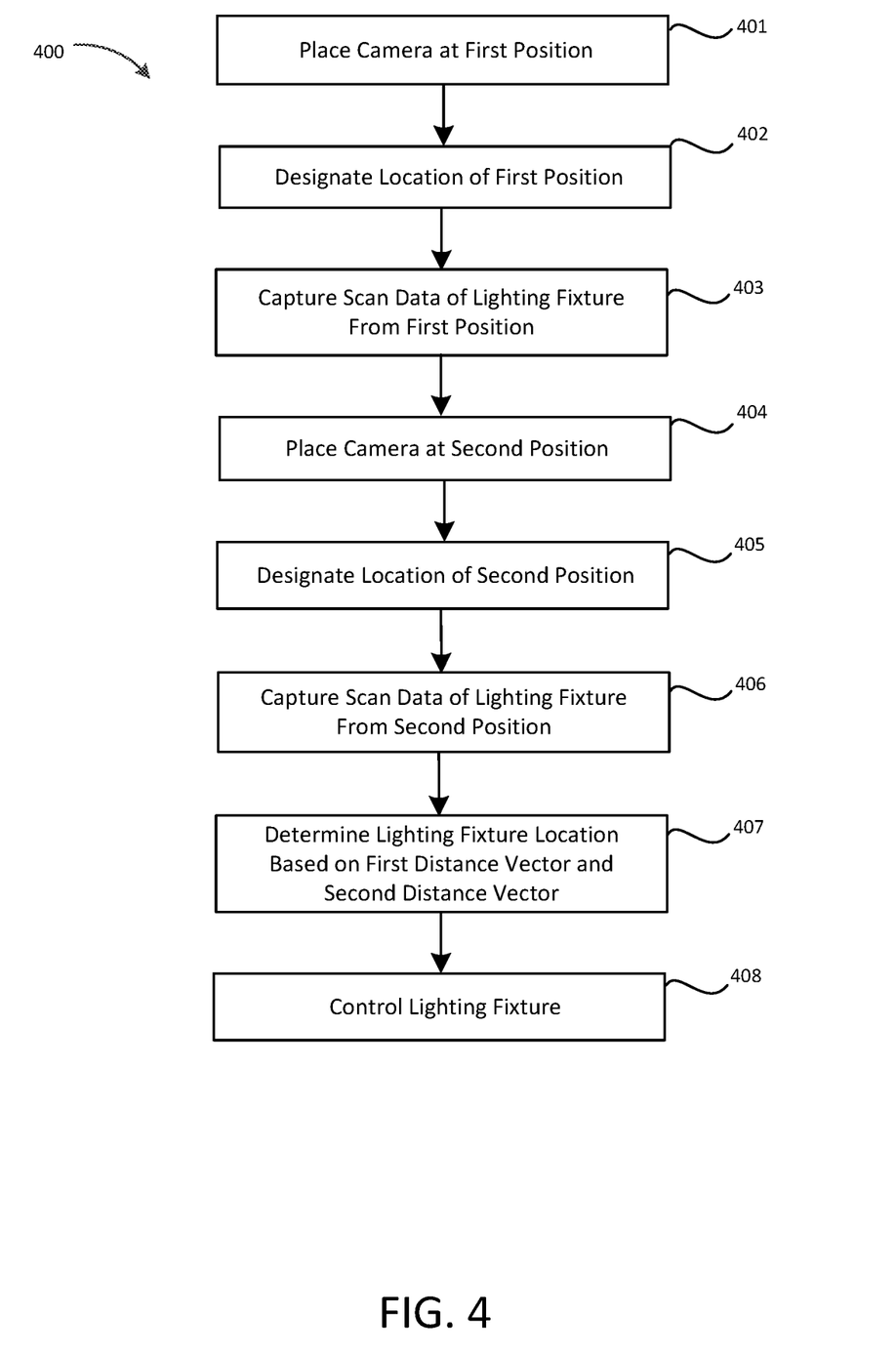
FIG. 4 illustrates a method of locating and subsequently controlling one or more of the lighting fixtures of the system of FIG. 1.

FIG. 4 illustrates a method 400 of locating and subsequently controlling one or more lighting fixtures 130. The method 400 includes placing a camera 135 in the venue 305 at a first position (step 401). The placement of the camera 135 includes mounting the camera 135 at the first position, holding the camera 135 at the first position, or the like.

The method 400 further includes identifying or designating the first position (step 402). This designation can be determined with hand-measurements, scan data gathered by the camera 135 of the relative location of one or more reference points 310, manual input of location values, or the like. The method 400 also includes capturing scan data or images of the lighting fixture 130 with the camera 135 at the first position (step 403).

The method 400 further includes placing a camera 135 in the venue 305 at a second position (step 404). The camera 135 at the second position may be the same camera 135 as that placed at the first position (i.e., the camera 135 is moved from the first position to the second position). In other embodiments, the camera 135 at the second position is an additional camera 135 to the camera 135 at the first position.

The method 400 further includes identifying or designating the second position (step 405). This designation can be determined with hand-measurements, scan data gathered by the camera 135 of the relative location of one or more reference points 310, manual input of location values, or the like. The method 400 also includes capturing scan data or images of the lighting fixture 130 with the camera 135 at the second position (step 406).

The method 400 further includes determining, identifying, or otherwise designating the lighting fixture 130 location by comparing a first distance vector based on the scan data captured in step 403 with a second distance vector based on the scan data captured in step 406 (step 407). In some embodiments, the controller 200 determines the location of an intersection of the first distance vector and the second distance vector. In other embodiments, the controller 200 determines the location where the first distance vector and the second distance vector are closest to each other (which may include intersection).

The method 400 further includes controlling operation and/or movement (e.g., orientation) of the lighting fixture 130 (after all the previous steps have been completed) based on the previously determined lighting fixture location (step 408). The lighting fixture 130 can be controlled by commands via the control board 125, commands via an interactive environment, pointing a destination indictor, or the like.

Thus, embodiments described herein provide, among other things, systems, methods, and devices for arrangement information acquisition and lighting fixture control. Various features and advantages are set forth in the following claims.

What is claimed is:

1. A system for determining a location of a lighting fixture in a venue, the system comprising:
   a camera configured to capture images of the lighting fixture; and
   a controller operatively coupled to the camera, the controller configured to:
      designate a first position of the camera,
      receive a first image of the lighting fixture from the camera in the first position,
      determine a first distance vector between the camera at the first position and the lighting fixture based on the first image,
      designate a second position of the camera,
      receive a second image of the lighting fixture from the camera in the second position,
      determine a second distance vector between the camera at the second position and the lighting fixture based on the second image,
      determine a vector relationship location to be a location nearest both the first distance vector and the second distance vector,
      designate the vector relationship location as the location of the lighting fixture,
      recognize a shape of the lighting fixture in at least one of the first image and the second image, the shape of the lighting fixture including at least a portion of an outline of the lighting fixture, and
      determine an orientation of the lighting fixture including a forward direction of the lighting fixture based on the shape.

2. The system of claim 1, wherein the vector relationship location is located at an intersection of the first distance vector and the second distance vector.

3. The system of claim 1, further comprising a user input device operatively coupled to each of the camera and the controller.

4. The system of claim 3, wherein the camera and the user input device are integrated together in a single device.

5. The system of claim 4, wherein the single device is a smart phone.

6. The system of claim 3, wherein the controller is further configured to receive the first position of the camera and the second position of the camera from the user input device to designate the first position of the camera and the second position of the camera.

7. The system of claim 3, wherein the controller is further configured to control operation of the lighting fixture based on commands received by the user input device and based on the vector relationship location.

8. The system of claim 1, wherein the controller is further configured to:
   designate a third position of the camera;
   receive a third image of the lighting fixture from the camera in the third position;
   determine a third distance vector between the camera at the third position and the lighting fixture based on the third image; and
   determine the vector relationship location to be a location nearest all three of the first distance vector, the second distance vector, and the third distance vector.

9. The system of claim 8, wherein the vector relationship location is located at an intersection of all three of the first distance vector, the second distance vector, and the third distance vector.

10. The system of claim 1, wherein the controller is further configured to designate the first position of the camera and the second position of the camera based on at least one image captured by the camera, the at least one image including one or more reference points.

11. A system for determining a location of a lighting fixture in a venue, the system comprising:
   a first camera placed in a first position, the first camera configured to capture a first image of the lighting fixture;
   a second camera placed in a second position, the second camera configured to capture a second image of the lighting fixture; and
   a controller operatively coupled to the first camera and the second camera, the controller configured to:
      designate the first position of the first camera,
      receive the first image of the lighting fixture from the first camera,
      determine a first distance vector between the first camera at the first position and the lighting fixture based on the first image,
      designate the second position of the second camera,
      receive the second image of the lighting fixture from the second camera,
      determine a second distance vector between the second camera at the second position and the lighting fixture based on the second image,
      determine a vector relationship location to be a location nearest both the first distance vector and the second distance vector,
      designate the vector relationship location as the location of the lighting fixture,
      recognize a shape of the lighting fixture in at least one of the first image and the second image, the shape of the lighting fixture including at least a portion of an outline of the lighting fixture, and determine an orientation of the lighting fixture including a beam projection direction of the lighting fixture based on the shape.

12. The system of claim 11, further comprising:
a third camera operatively coupled to the controller, the third camera placed in a third position, the third camera configured to capture a third image of the lighting fixture,
wherein the controller is further configured to:
  designate the third position of the third camera,
  receive the third image of the lighting fixture from the third camera,
  determine a third distance vector between the third camera at the third position and the lighting fixture based on the third image, and
  determine the vector relationship location to be a location nearest all three of the first distance vector, the second distance vector, and the third distance vector.

13. The system of claim 11, further comprising
a user input device operatively coupled to each of the first camera, the second camera, and the controller, and
wherein the controller is further configured to receive input commands from the user input device.

14. The system of claim 13, wherein the controller is further configured to control operation of the lighting fixture based on commands received by the user input device and based on the vector relationship location.

15. A method of determining a location of a lighting fixture in a venue, the method comprising:
  capturing a first image of the lighting fixture from a first position;
  determining a first distance vector between the first position and the lighting fixture;
  capturing a second image of the lighting fixture from a second position;
  determining a second distance vector between the second position and the lighting fixture;
  determining a vector relationship location where the first distance vector and the second distance vector are nearest to each other;
  designating the vector relationship location as the location of the lighting fixture;
  recognizing a shape of the lighting fixture in at least one of the first image and the second image, the shape of the lighting fixture including at least a portion of an outline of the lighting fixture;
  determining an orientation of the lighting fixture based on the shape; and
  controlling movement of the lighting fixture to change the orientation of the lighting fixture.

16. The method of claim 15, further comprising transporting a camera from the first position to the second position, wherein the transporting occurs after capturing the first image of the lighting fixture and before capturing the second image of the lighting fixture.

17. The method of claim 15, further comprising controlling operation of the lighting fixture based on a command received by a user input device and based on the vector relationship location.

18. The system of claim 1, wherein the controller is further configured to control movement of the lighting fixture to change the orientation of the lighting fixture.

19. The system of claim 1, wherein the controller is further configured to determine a make/model of the lighting fixture based on the shape of the lighting fixture.

20. The system of claim 11, wherein the controller is further configured to control movement of the lighting fixture to change the orientation of the lighting fixture.

21. The system of claim 11, wherein the controller is further configured to determine a make/model of the lighting fixture based on the shape of the lighting fixture.

22. The method of claim 15, further comprising determining a make/model of the lighting fixture based on the shape of the lighting fixture.

* * * * *